(12) United States Patent
Kuchibhotla

(10) Patent No.: US 8,596,823 B2
(45) Date of Patent: Dec. 3, 2013

(54) LINE-PROJECTION APPARATUS FOR ARRAYS OF DIODE-LASER BAR STACKS

(75) Inventor: Sivarama Krishna Kuchibhotla, San Jose, CA (US)

(73) Assignee: Coherent, Inc., Santa Clara, CA (US)

( * ) Notice: Subject to any disclaimer, the term of this patent is extended or adjusted under 35 U.S.C. 154(b) by 457 days.

(21) Appl. No.: 12/967,330

(22) Filed: Dec. 14, 2010

(65) Prior Publication Data

US 2012/0057345 A1 Mar. 8, 2012

Related U.S. Application Data

(60) Provisional application No. 61/380,503, filed on Sep. 7, 2010.

(51) Int. Cl.
G02B 27/20 (2006.01)

(52) U.S. Cl.
USPC ............ 362/259; 362/553; 362/268; 362/335

(58) Field of Classification Search
USPC .................. 362/259, 553, 268, 335, 337, 340; 359/619, 626, 710, 101, 618, 820, 359/210.1, 824; 356/432, 4.09; 219/121.65, 219/121.76, 121.61, 121.75; 358/475; 372/26, 92, 101, 15, 28, 34, 36, 75, 21, 372/32, 22, 38.06, 70, 68; 353/122; 355/67; 385/20, 24, 60, 33; 235/462, 35
See application file for complete search history.

(56) References Cited

U.S. PATENT DOCUMENTS

| | | | |
|---|---|---|---|
| 5,900,981 A | 5/1999 | Oren et al. | |
| 6,771,686 B1 | 8/2004 | Ullman et al. | |
| 6,773,142 B2 | 8/2004 | Rekow | |
| 7,016,393 B2 | 3/2006 | Anikitchev et al. | |
| 7,135,392 B1 * | 11/2006 | Adams et al. ................. | 438/513 |
| 7,265,908 B2 | 9/2007 | Anikitchev | |
| 7,355,800 B2 | 4/2008 | Anikitchev | |
| 7,428,039 B2 | 9/2008 | Ferber | |
| 7,545,838 B2 | 6/2009 | Fontanella et al. | |
| 7,615,722 B2 | 11/2009 | Govorkov et al. | |
| 2008/0013182 A1 | 1/2008 | Ferber | |
| 2009/0152247 A1 | 6/2009 | Jennings et al. | |

FOREIGN PATENT DOCUMENTS

WO 2005/085934 A1 9/2005

OTHER PUBLICATIONS

International Search Report and Written Opinion received for PCT Patent Application No. PCT/US2011/049706, mailed on Dec. 9, 2011, 9 pages.
International Search Report received for PCT Patent Application No. PCT/US2012/031732, mailed on Oct. 2, 2012, 4 pages.

(Continued)

*Primary Examiner* — Sean Gramling
*Assistant Examiner* — Danielle Allen
(74) *Attorney, Agent, or Firm* — Morrison & Foerster LLP

(57) ABSTRACT

In optical apparatus for illuminating a mask-plane with a line of light, a light source includes four fast-axis stacks of laser diode bars. One optical arrangement collects light beams from all of the diode-laser bar stacks, homogenizes and expands the beams in the fast-axis direction of the diode-laser bar stacks and partially overlaps the homogenized and expanded beams in the fast-axis direction. Another optical arrangement homogenizes the sum of the partially overlapped beams and images the sum of the beams as a line of light having a length in the fast-axis-direction and a width in the slow-axis direction.

16 Claims, 7 Drawing Sheets

(56) References Cited

OTHER PUBLICATIONS

Bayer et al., "Beam Shaping of Line Generators Based on High Power Diode Lasers to Achieve High Intensity and Uniformity Levels", Proc. of SPIE, vol. 7062, 2008, pp. 70620X-I-70620X-7.

Huang et al., "Laser Diode End-Pumped Efficient Coupling System Based on Microlens Arrays", Proc. of SPIE, vol. 7506, 2009, pp. 75061E-1-75061E-5.

Kohler et al., "11-kW Direct Diode Laser System with Homogenized 55 × 20 mm2 Top-Hat Intensity Distribution", Proc. of SPIE, vol. 6456, 2007, pp. 64560O-1-64560O-12.

Non Final Office Action received for U.S. Appl. No. 13/082,171, mailed on Dec. 19, 2012, 14 pages.

International Preliminary Report on Patentability received for PCT Patent Application No. PCT/US2011/049706, mailed on Mar. 21, 2013, 7 pages.

* cited by examiner

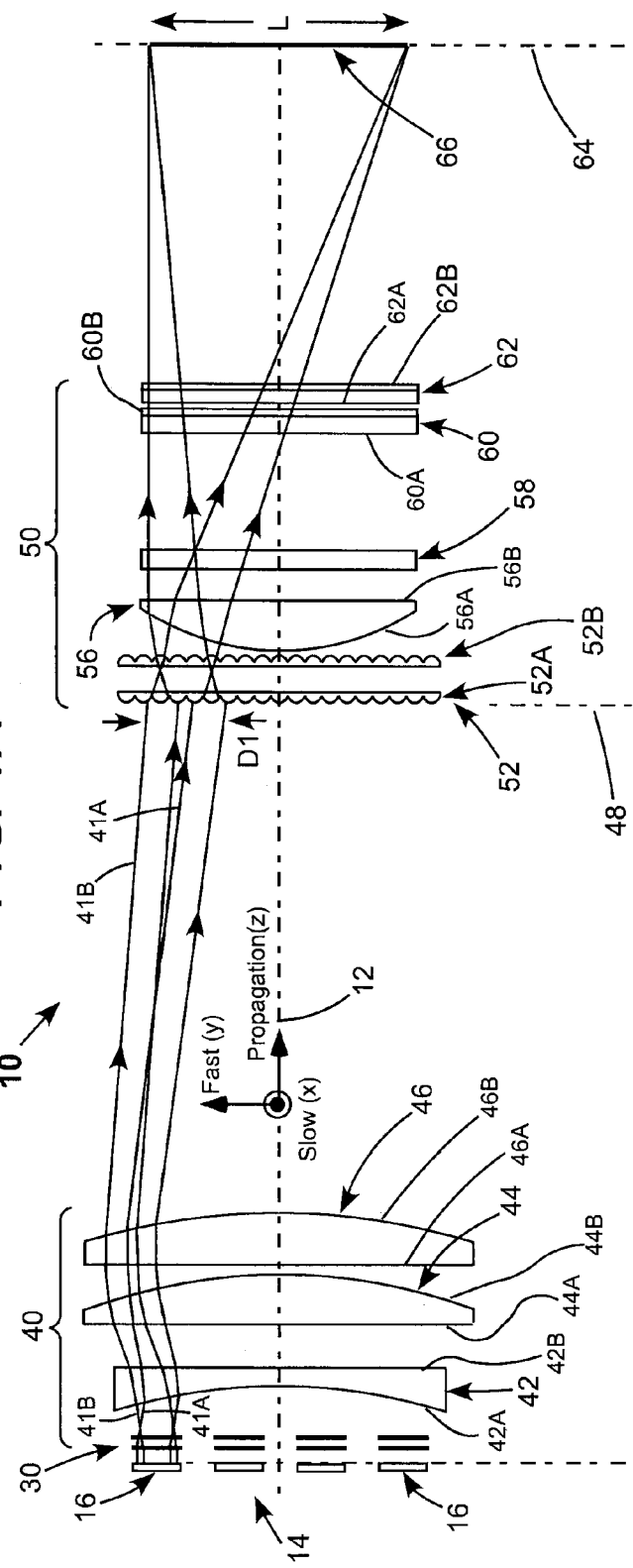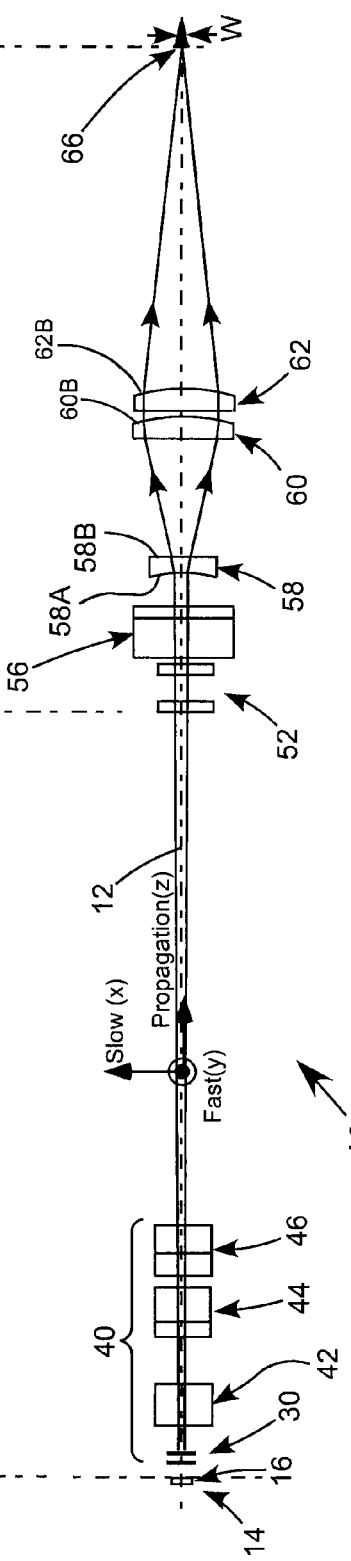

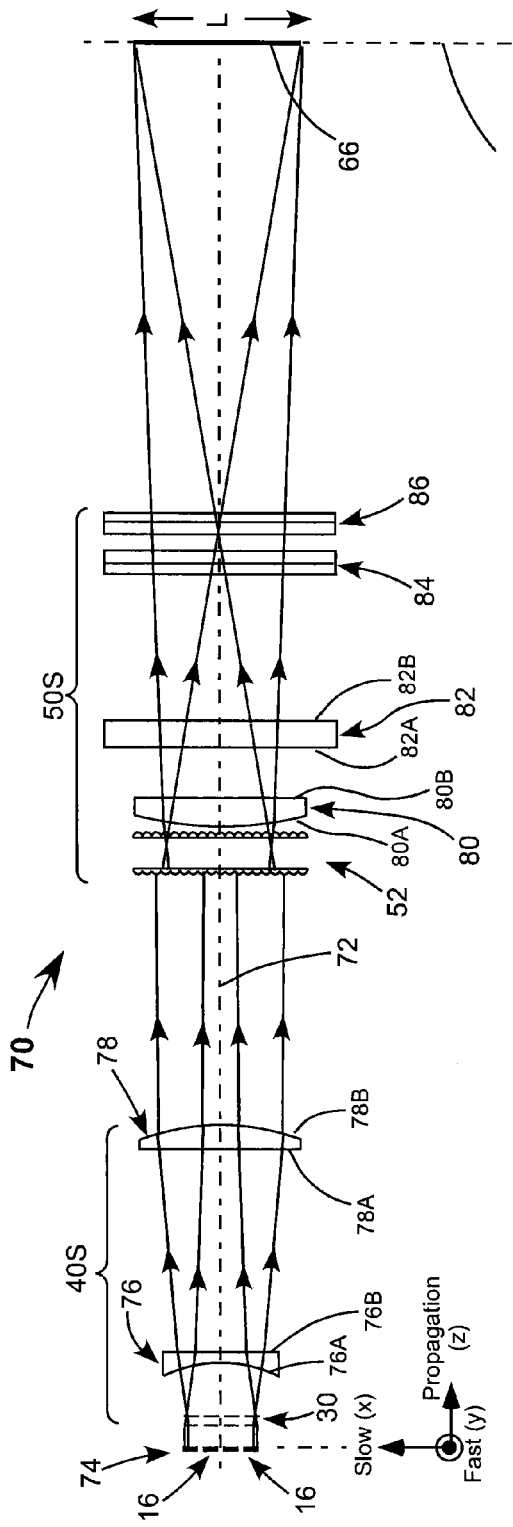
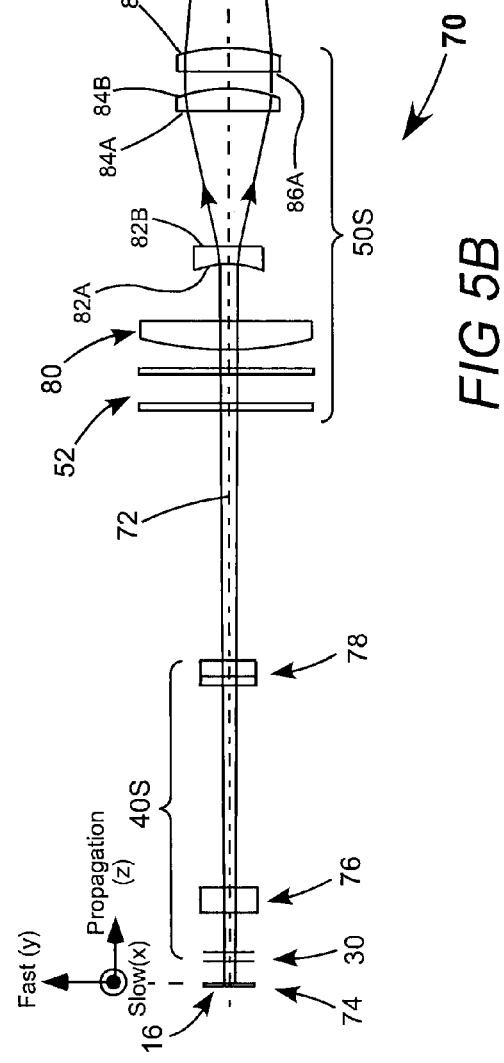

LINE-PROJECTION APPARATUS FOR ARRAYS OF DIODE-LASER BAR STACKS

PRIORITY CLAIM

This application claims priority to prior Provisional Application Ser. No. 61/380,503, filed Sep. 7, 2010, the disclosure of which is incorporated herein by reference.

TECHNICAL FIELD OF THE INVENTION

The present invention relates in general to optical apparatus for projecting the output of one or more lasers into a line of light. The invention relates in particular to apparatus for forming very uniform line of light from the output of group of diode-laser bars

DISCUSSION OF BACKGROUND ART

There are several applications for laser radiation projected to form a line of light on a target. Early versions of such line-projection apparatus for diode-lasers were found in barcode readers and the like. Here, however, uniformity of illumination along the line was at most a secondary consideration.

Later versions of diode-laser line projection apparatus were developed for spatial light modulators (SLMs) in laser printers, image projectors, and the like. Here, power in the line of light was not required to be very high, and could be delivered by a simple one-dimensional laser array, commonly referred to as a diode-laser bar. Uniformity of illumination along the line of light in these applications is important. An "ideal" line of radiation requires a Gaussian intensity distribution of intensity in the width of the line and a uniform or "flat-top" distribution along the length of the line. This uniformity requirement encouraged the invention of projection optics that would provide adequate uniformity. Examples of such projection optics are described in U.S. Pat. No. 6,773,142, U.S. Pat. No. 7,016,393, U.S. Pat. No. 7,265,908, and U.S. Pat. No. 7,355,800, all of which are assigned to the assignee of the present invention.

A recent application for a projected line of diode-laser light is in patterning operations for organic light emitter displays. Here the line of light illuminates a mask having apertures defining emitter features for one primary color of the display. The illuminated features are projected by a projection lens onto a donor foil coated with a layer of organic emitting material for that color. This process sometimes referred to as laser induced thermal imaging (LITI). Exposed regions of the foil are transferred to an active matrix back-plate of the display. The process is repeated for building different primary colors of the display. The process is commercially more effective the longer the line of light that can be projected, and the higher the intensity of the light in the line. The intensity is dependent, for any given line-length, on the power of the illumination and the narrowness of the line More laser power provides that a longer line can be projected at a given illumination intensity. Preferred line lengths for OLED manufacture greatly exceed the length of lines of light used for illuminating SLMs which are typically only about 25 millimeters (mm) long. A desirable line-of-light for OLED manufacturers would have a length of about 200 mm and a width of about 0.2 mm or less, with about 5 kilowatts (kW) total power delivered into the line. The line would preferably have Gaussian distribution of intensity in the line width, and a uniform ("flat top") distribution in the line length. Depending on the optical efficiency illuminating apparatus, this would require a diode-laser source with a total power in excess of about 7 kW. As the power available from a typical multimode diode-laser bar is only on the order of 70 Watts (W), such a 7 kW-source would require about 100 diode-laser bars.

Each emitter has a height (in what is usually referred to as the fast-axis) of about 2 micrometers ($\mu m$) and a width (in what is usually referred to as the slow-axis) of about 100 $\mu m$. The ratio of the total width of emitters to the length of the diode-laser bar is usually referred to as the fill-factor. Each emitter delivers an astigmatic beam having a divergence in the fast-axis of about 35°, but a substantially Gaussian intensity cross-section, and a divergence in the slow-axis of about 10° but a more complex intensity cross-section. Two-dimensional arrays of diode-laser emitters have been made by stacking diode-laser bars in the fast-axis direction in diode-laser bar modules. However, each diode-laser bar must be individually cooled, and there is a practical limit to how many can be stacked in a module, dependent, inter alia, on selecting sufficient bars from a batch with adequate specifications. Certainly modules with 100 fast-axis stacked bars are not commercially available at present and it is believed that 100-bar stacks may not be available at economical cost, if at all for many years into the future.

It is to be expected that a multi-kilowatt diode-laser source will comprise some arbitrary array of such diode-laser-bar stacks, providing a two dimensional array of individual emitters. The emitters will be in a non-uniform, however symmetrical, distribution, with each emitter delivering a non-uniform beam with not necessarily the same non-uniformity. There is a need for an optical arrangement capable of delivering from such a source a line of radiation having a length of 200 mm or greater and a width of 0.2 mm or less with a Gaussian or near-Gaussian distribution of intensity in the line-width, and a uniform distribution of intensity in the line-length.

SUMMARY OF THE INVENTION

In one aspect of the present invention, optical apparatus for forming a line of radiation having a length and a width comprises a plurality of spaced-apart stacks of laser-diode bars. Each of the diode-laser bars has a plurality of diode-laser emitters, has a fast-axis and a slow-axis which is perpendicular to the fast-axis and parallel to a length dimension of the bars. The diode-laser bars in the stacks are stacked in the fast-axis direction thereof. A plurality of collimating arrangements is provided corresponding in number to the number of diode-laser bars for collimating the output radiation of the diode-laser bars in the diode-laser bars stacks in at least the fast-axis direction, thereby forming a plurality of output radiation beams corresponding in number to the plurality of diode-laser bar stacks. A first optical arrangement is configured to collect the output radiation beams from all of the diode-laser bar stacks, homogenize and expand the beams in the length direction of the line of radiation and partially overlap the homogenized expanded beams in the length direction of the line of radiation in a first plane at a predetermined distance from the first optical arrangement. A second optical arrangement is configured to homogenize and image the partially overlapped and expanded beams in a second plane at a predetermined distance from the second optical arrangement to form the line of radiation, with the homogenizing and imaging being arranged such that the line of radiation has an about uniform distribution of intensity along the length thereof.

In one embodiment of the inventive apparatus the length of the line of radiation is formed in the fast-axis direction of the diode-laser bar stacks with the width of the line in the slow-axis direction. In another embodiment of the inventive apparatus, the length of the line of radiation is formed in the slow-axis direction of the diode-laser bar stacks with the width of the line in the fast-axis direction.

Calculations indicate that both embodiments are capable of forming a line having a length of about 200 mm and a width of about 0.2 mm for four spaced apart diode-laser bar stacks each including 26 diode-laser bars. Assuming that each diode laser bar has an output 70 W for a total source power of 7,280 Watts, calculations indicate that in the case of both embodiments in excess of 4 kW of radiation will be delivered into the 200 mm×0.2 mm line of radiation.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 1A and FIG. 1B are respectively fast-axis and slow-axis views schematically illustrating one preferred embodiment of line illuminating apparatus in accordance with the present invention having a light source including four fast-axis diode-laser bar-stack modules aligned one above the other in the fast-axis-direction of the stacks, beam homogenizing and broadening optics for spreading and overlapping output beams from the diode-laser stack modules, and beam homogenizing and imaging optics for forming a line of light from the overlapped output beams with a length in the fast-axis direction and a width in the slow-axis direction.

FIG. 5A and FIG. 5B are respectively slow-axis and fast-axis views schematically illustrating another preferred embodiment of line illuminating apparatus in accordance with the present invention, similar to the apparatus of FIGS. 1A and 1B, but wherein the four fast-axis diode-laser bar-stack modules are aligned with each other along the slow-axis direction of the stacks, and the beam homogenizing and imaging optics form a line of light from the overlapped output beams with a length in the slow-axis direction and a width in the fast-axis direction.

DETAILED DESCRIPTION OF THE INVENTION

Figure 1C:
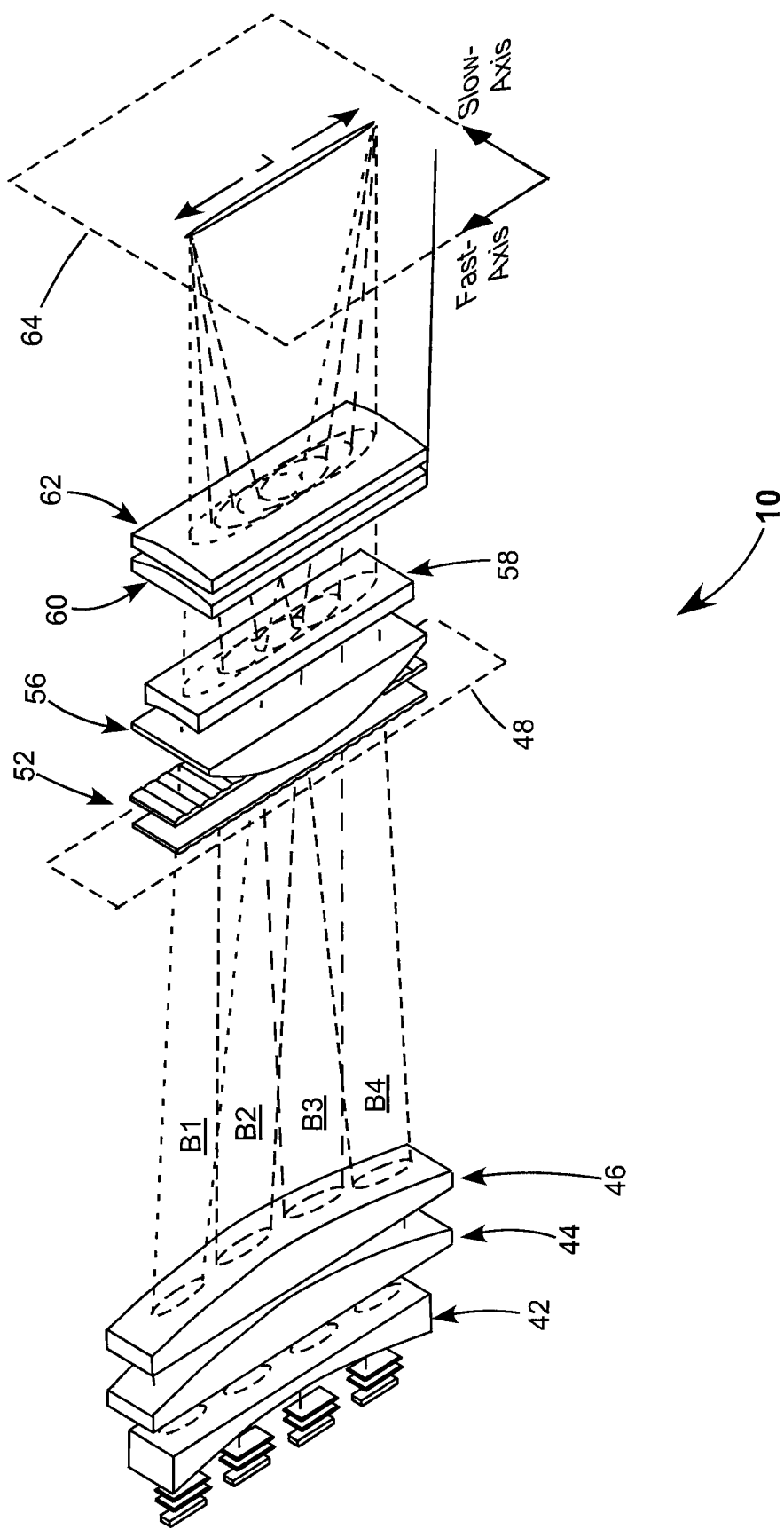
FIG. 1C is a three-dimension view schematically illustrating further details of the broadening and imaging optics of FIG. 1A and FIG. 1B.

Referring now to the drawings, wherein like components are designated by like reference numerals, FIG. 1A and FIG. 1B are respectively fast-axis and slow-axis views schematically illustrating one preferred embodiment 10 of line-illuminating apparatus in accordance with the present invention. Apparatus 10 has a system axis 12. FIG. 1C is a three-dimensional view schematically illustrating further details of the apparatus of FIGS. 1A and 1B.

Apparatus 10 has a light-source 14 including four fast-axis diode-laser bar-stack modules 16 aligned one above the other in the fast-axis-direction of the stacks. In the description of apparatus 10 set forth below the apparatus is also described, for convenience of description, as having a fast-axis and a slow-axis corresponding to the same axes of the diode-laser bars. These can also be arbitrarily designated respectively as the y-axis and the x-axis, corresponding to the tangential and sagittal axes of optics the apparatus. The propagation axis (z-axis) of the diode-laser bar stacks is parallel to system axis 12, i.e., the z-axis of the optics.

Figure 2A:
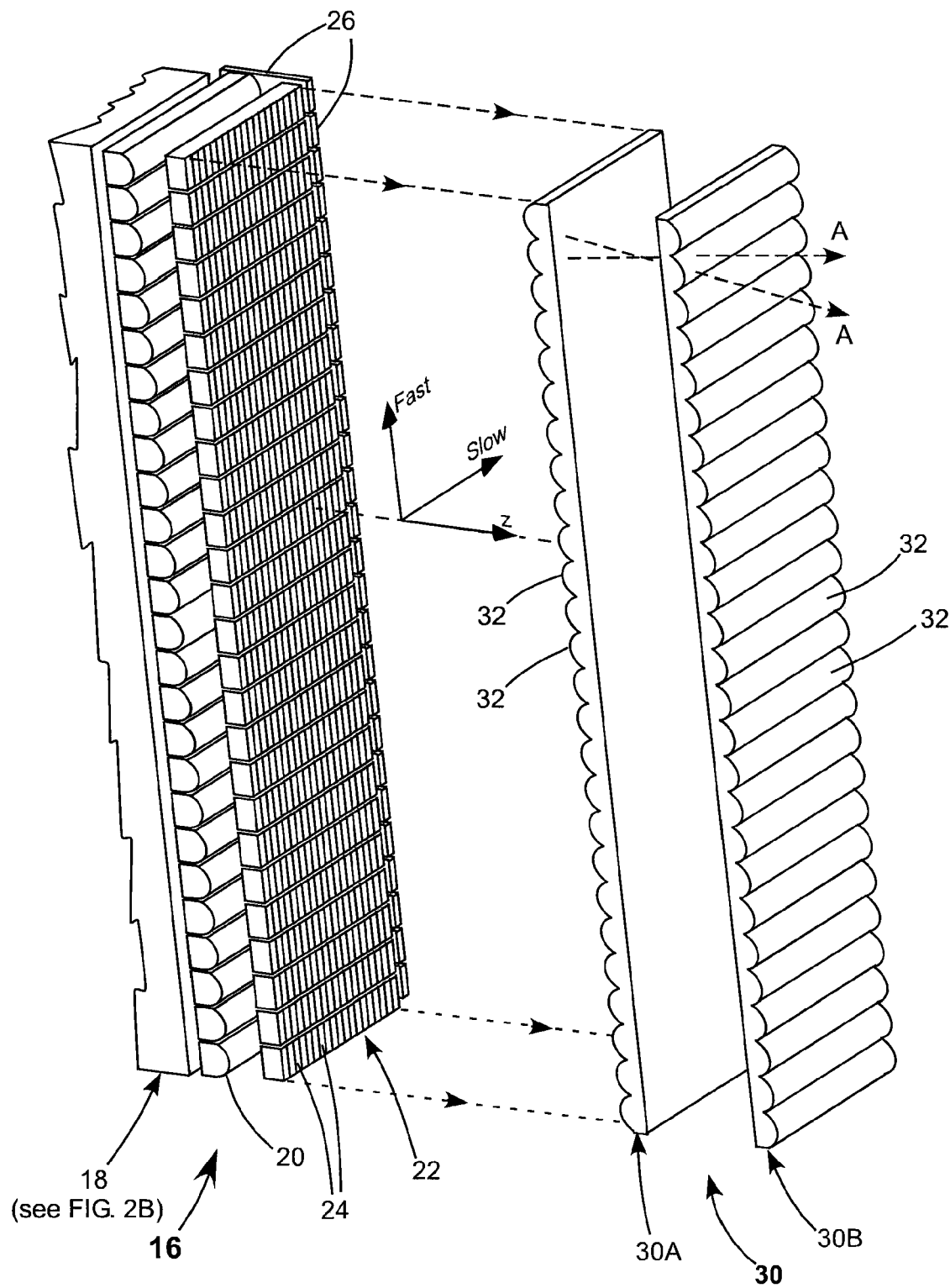
FIG. 2A is three-dimensional view schematically illustrating one of the diode-laser bar-stack modules of the apparatus of FIGS. 1A and 1B including a fast-axis diode-laser bar stack a fast-axis collimating lens for each diode-laser bar and a slow-axis collimating lens for each emitter of each diode-laser bar.
Figure 2B:
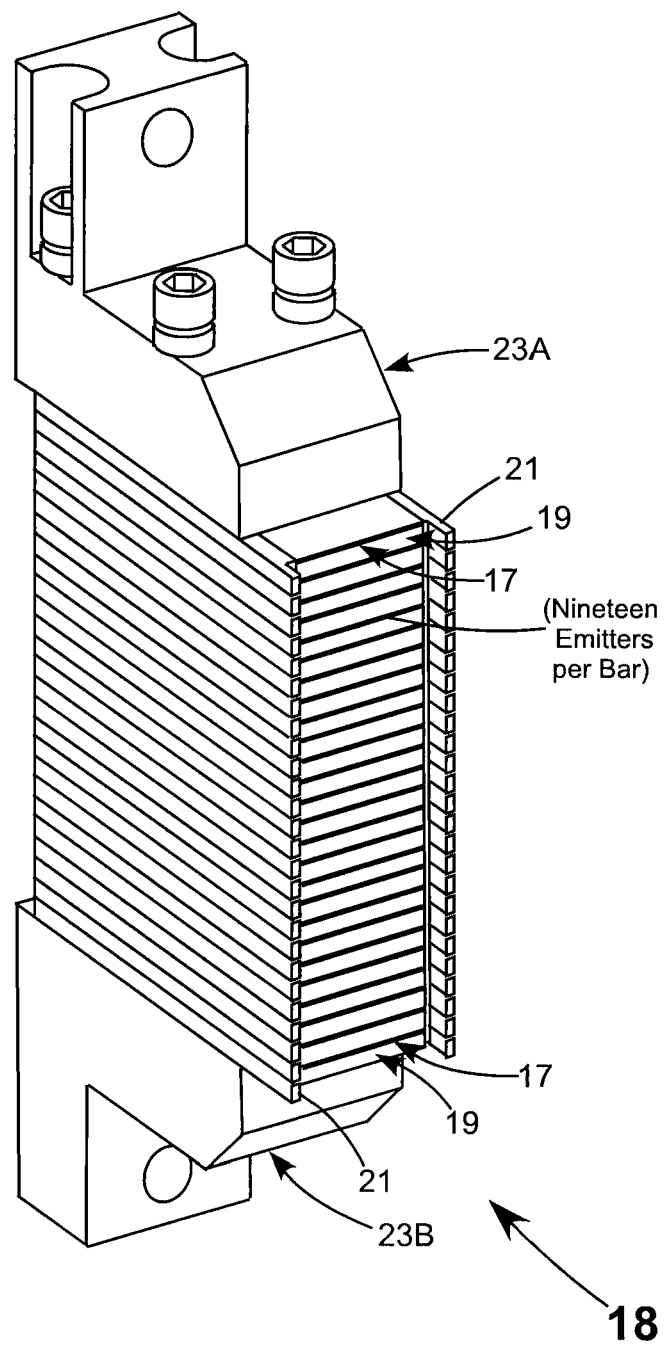
FIG. 2B is a three-dimensional view schematically illustrating details of the diode-laser bar stack of FIG. 2A.

FIG. 2A is a three-dimensional view schematically illustrating details of diode-laser module 16. The module includes a fast-axis diode-laser bar stack 18 here assumed to be a stack of twenty-six (26) diode-laser bars. Details of one-example of the stack construction are depicted in FIG. 2B. Here, each diode-laser bar 17 is mounted on the front of a corresponding heat sink member 19. The heat-sink members are clamped together between clamping and mounting blocks 23A and 23B. Each heatsink member has a forward extending portion 21 to which a fast-axis collimating (FAC) lens or a module including a FAC lens and a slow-axis collimating (SAC) lens array can be attached.

Referring again to FIG. 2A, each of the diode laser bars has a dedicated fast-axis collimating (FAC) lens 20, which, as then name suggests collimates light from each emitter in the bar in the highly divergent fast-axis direction. Clearly, there are twenty-six lenses 20. Spaced apart from each FAC lens in the z-axis direction is an array 22 of slow-axis collimating (SAC) lenses 24. The number of lenses 24 in each array 22 corresponds with the number of spaced-apart emitters (diode-lasers) in each of the diode-laser bars. Here, it is assumed that there are nineteen (19) emitters in each bar. Each SAC lens is aligned with a corresponding emitter. The FAC lenses and SAC lens-arrays are held in alignment with each other by brackets 26 (shown on only one side in FIG. 2 for convenience of illustration). Assemblies of FAC and SAC lenses are available from several commercial suppliers.

The FAC and SAC lenses are preferably spaced apart in the Z-axis by a distance just sufficient to allow the slow-axis diverging beam from each emitter to almost fill a corresponding SAC lens 24. This distance will depend in any example on the actual divergence, and the emitter-width and spacing (the fill factor). In the example under consideration it is assumed that the emitter width is 100.0 μm, the emitter pitch is 0.5 mm, and the spacing between the FAC and SAC lenses is 3.0 mm.

It is pointed out here that collimation of the light from the diode laser emitters will never be perfect this is due, inter alia, to the relatively poor beam-quality of a beam from a diode-laser emitter, the relative simplicity of the collimating lenses and to misalignment of emitters in any bar along the slow-axis, a manufacturing artifact, whimsically referred to by practitioners of the art as "smile". This "smile" will vary from bar to bar. It should also be noted that while collimating in the fast-axis is always necessary, in certain configurations, slow-axis collimation may be omitted in view of the relatively low divergence in this axis.

Also depicted in FIG. 2 is a cylindrical micro-lens array arrangement 30, here, including two spaced-apart cylindrical arrays of convex-plano (plano-convex) lenses 32 with cylindrical axes thereof aligned parallel to the slow-axis direction. There are twenty-six lenses 32 in each array, corresponding to the number of diode-laser bars in stack 18 thereof but this should not be construed as limiting the present invention. Preferably the micro-lenses in the two arrays have the same focal length and the arrays are preferably spaced apart by slightly more than the focal length a lens 32. Collimated rays from the FAC and SAC lenses are caused by the cylindrical micro-lenses to diverge strongly in the fast-axis direction as depicted in FIG. 2A by arrows A. The micro-lens arrangement is part of an optical grouping described further hereinbelow, but is first described with reference to FIG. 2A, which has a scale sufficient to show detail of the micro-lens arrangement.

It should be noted, here, that the term "cylindrical" as applied to lenses referred to in this description and the appended claims, refers to any lens that has finite optical power in only of two orthogonal axes. The term is applicable, for convenience of description, to lenses where optical power is supplied by a pure cylindrical surface or a convex or concave surface having a more complex, i.e., "acylindrical" form.

Referring again to FIGS. 1A and 1B, apparatus 10 includes a beam homogenizing and expanding module 40 including the micro-lens arrangement 30, a concave-meniscus lens element 42, a plano-convex lens element 44 and another plano-convex lens element 46. Entrance and exit surfaces of the lens elements are designated by the lens reference numeral with suffices A and B respectively. This convention applies to all other lens elements described and depicted herein.

The group of elements 42, 44, and 46 has net positive optical power. The micro-lens arrangement spreads pairs of parallel rays in the Gaussian fast-axis distribution of radiation from any emitter in any diode-laser bar into a pair of diverging rays as depicted by rays 41A and 41B in FIG. 1A. Element 42 having negative optical power directs the spreading rays away from system-axis 12.

The spreading pairs are then directed by the elements 44 and 46 (having positive optical power)) back toward the system axis with reduced divergence (spread). In a plane 48 at some distance from element 46 ray pairs from any element in any one diode-laser bar will overlap to some extent. In the fast-axis height D1 representing the expanded width of the beam from the upper diode-laser bar module, the net intensity distribution will be the about-Gaussian distribution characteristic of the fast-axis intensity distribution from any emitter. In the slow-axis, any collimated rays from the diode-laser module will remain collimated after passing through beam homogenizer and expander 40 as elements 42, 44, and 46 are cylindrical optical elements having zero optical power in the slow-axis.

Limited space in the drawing of FIG. 1A does not permit illustrating rays from all diode-laser bar modules, however, it will be evident to one skilled in the optical arts from the few exemplary rays traced in FIG. 1A, that other rays from other diode-laser bar modules 16 will be affected in the same way by beam homogenizer and expander 40. Referring to FIG. 1C, a result of this will be that in plane 48 there will be four beam-portions B1, B2, B3, and B4 (one from each of the four diode-laser bar modules), which will be aligned and partially overlapping in the fast-axis direction in plane 48, with the fast-axis distribution of intensity in each beam-portion being about Gaussian, corresponding to the fast-axis distribution from any one emitter.

Referring again the FIGS. 1A and 1B, the partially overlapping beam-portions from fast-axis beam homogenizer and expander 40 are delivered to a beam homogenizing and imaging group 50 a first component of which is a cylindrical micro-lens array arrangement 52, including spaced-apart micro-lens arrays 52A and 52B. In this example the micro-lens arrays each include nineteen fast-axis micro-lenses suitably chosen to spread across the complete non-uniform input beam from the combined Gaussian beams in plane 48, then with the cooperation of other optics in group 50, further homogenize and image the input beam.

Cylindrical lenses of the micro-lens arrays spread corresponding portions of the radiation delivered thereto into diverging bundles. A cylindrical lens 56, immediately following micro-lens arrangement 52, and having positive power in the fast-axis, further spreads the bundles in a manner such that all bundles are spread and fully overlap throughout the length L of a line of light 66 in a plane 64 in which a mask to be illuminated would be placed. This results in a very uniform distribution of light (radiation) along the line. Additional cylindrical lens elements 58, 60, and 62 have optical power in the slow-axis only and focus the collimated or near-collimated slow-axis rays from each diode-laser bar module in plane 64, with the width of the focused radiation defining the width W of line of light 66. Elements 58 and 60 function as an essentially afocal beam-expander in the slow-axis, with element 62 responsible for final slow-axis focusing.

The performance of one example of apparatus 10 configured to provide a line of light 66 having a length of about 200 mm and a width of about 0.2 mm was calculated using ZEMAX® optical design software available from ZEMAX Development Corporation, of Bellevue, Wash. In this example, the following assumptions were made.

Each diode laser bar has 19 emitters with a 0.5 mm pitch between emitters. There are 26 diode-laser bars in each stack with a pitch of 1.65 mm between the bars in the stack. Each bar has a FAC lens and a SAC lens-array as described above. The stacks are spaced apart by 30 mm along the fast-axis direction. Each bar has a total of 70 W output at a wavelength of 908 nanometers (nm) providing a total light source power of 7280 W (7.280 kW).

Micro-lenses in the micro-lens arrays 30 thereof have an ROC of 3.0 mm with a 1.65 mm pitch. The micro-lens array pair is spaced 20.0 mm from the SAC lens arrays. The ROC and pitch of the lenses is subject to variation in optimizing the distribution of illumination at the entrance to micro-lens arrays 52.

Negative lens element 42 is a fused silica lens element having an axial thickness of 15.0 mm with surface 42A having a radius of curvature (ROC) of −500 mm and surface 42B being planar. Element 42 is axially spaced from the micro-lens arrays by a distance of 75.0 mm. Positive lens element 44 is a fused silica lens element having an axial thickness of 45.0 mm with surface 44A thereof being planar and surface 44B having a ROC of 500.0 mm. Element 44 is axially spaced from element 42 by a distance of 85.0 mm. Positive lens element 46 is a fused silica lens element having an axial thickness of 45.0 mm, with surface 46A thereof being planar and surface 46B having a ROC of 600.0 mm. Element 46 is axially spaced from element 44 by a distance of 104.0 mm.

In arrangement 50, cylindrical micro-lens arrays in array pair 52 have a 12.0 mm ROC and a 14.0 mm pitch. The micro-lens array pair is spaced 460.0 mm from element 46 and the micro-lens arrays are spaced apart by 27.0 mm.

Lens element 56 is a fused silica lens having an axial thickness of 45.0 mm, with surface 56A having an ROC of 250.0 mm and surface 56B being planar. Lens element 56 is axially spaced from the micro-lens arrays by a distance of 5.0 mm. Lens element 58 is a fused silica lens having an axial thickness of 15.0 mm with surface 58A thereof having an ROC of −60.0 mm and surface 58B being planar. Element 58 is axially spaced 30.0 mm from element 56. Lens element 60 is a fused silica lens having an axial thickness of 20.0 mm with surface 60A being planar and surface 60B having an ROC of −150.0 mm. Element 60 is axially spaced 165.0 mm from element 58. Lens element 62 is a fused silica lens element having an axial thickness of 20.0 mm with surface 62A being planar and with surface 62B having an ROC of −150 mm. Element 62 is axially spaced 5.0 mm from element 60. The axial distance from element 62 to plane 64 is 330.0 mm.

Figure 3:
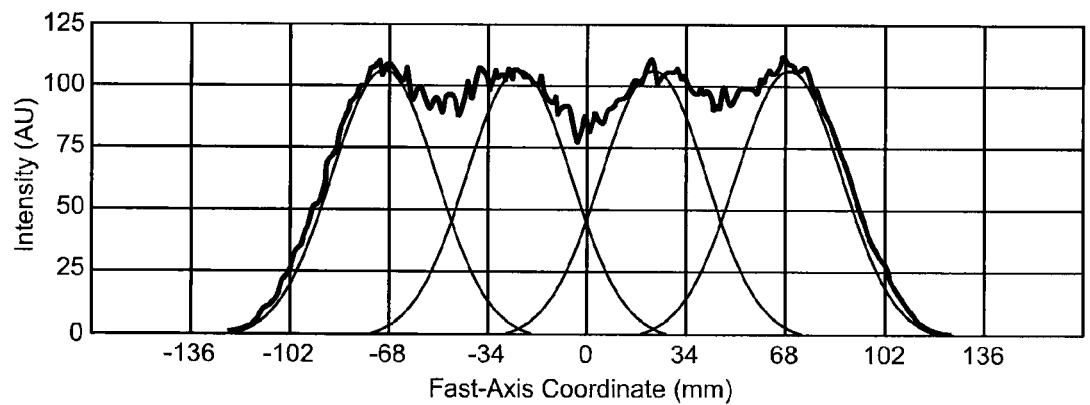
FIG. 3 is graph schematically illustrating calculated intensity distribution as a function of fast-axis coordinate for one example of the apparatus of FIGS. 1A and 1B at the entrance to the beam homogenizing and imaging optics.

FIG. 3 is a graph schematically illustrating intensity distribution (bold curve) in the fast-axis as a function of the fast-axis coordinate at the entrance to micro-lens array pair 52, i.e., in plane 48. This intensity distribution, while not close to uniform is regular and appears to approximate partially overlapping combination of four Gaussian intensity distributions, one from the homogenized output of each of the diode-laser bar stack modules. Arbitrary artificial Gaussian curves (fine curves) are plotted to emphasize this.

Figure 4:
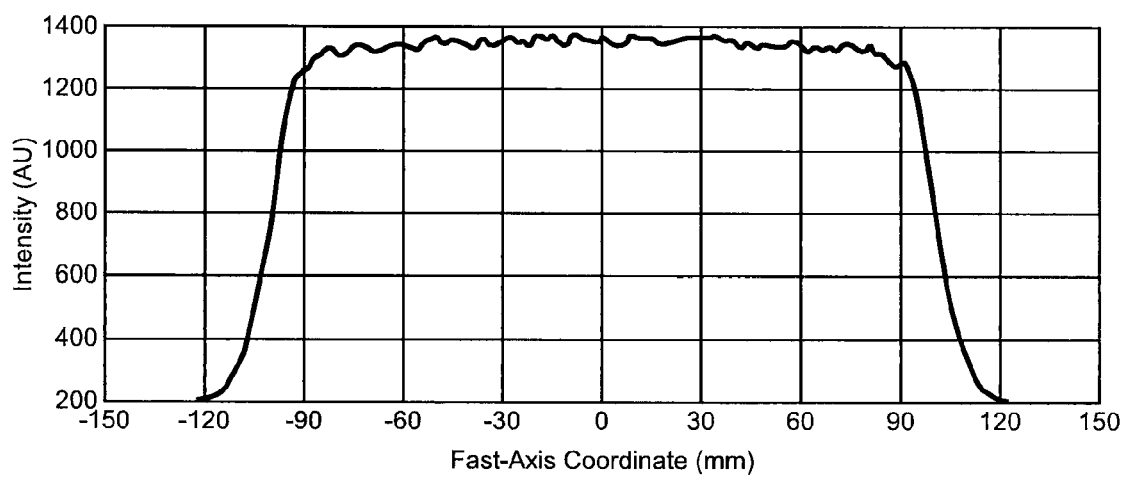
FIG. 4 is graph schematically illustrating calculated intensity distribution as a function of fast-axis coordinate for the example of the apparatus of FIGS. 1A and 1B in a line of light formed by the beam homogenizing and imaging optics.

FIG. 4 is a graph schematically illustrating intensity distribution in the fast-axis as a function of the fast-axis coordinate in line 66 in plane 64. The final line-uniformity over most of the line length is within about 5% of peak. Some of this uniformity variation may be due to using insufficient random rays in the intensity distribution calculation. Calculations indicated that 5.8 kW of radiation power would be delivered into the line of light from the total source power of 7.280 kW.

Recapitulating the description of inventive line-illuminating apparatus presented above, the apparatus includes a light-source comprising a plurality of spaced-apart fast-axis diode-laser-bar stack modules with light from each of the diode-laser bars being collimated in at least the fast-axis direction and preferably in both the fast-axis and slow-axis directions. The required line of light will have a length in the fast-axis direction and a width in the slow-axis direction.

In a beam-homogenizing and expanding arrangement 40, light from the diode-laser bar stack modules is spread into diverging ray bundles in the fast-axis by a cylindrical micro-lens arrangement. This is followed by a fast-axis cylindrical lens element group comprising (in the direction of propagation of light therethrough) an element having negative optical power in the fasts axis and two elements having positive optical power in the fast-axis with the group having net positive optical power. The lens group collects all of the collimated light from all of the diode-laser bar stack modules and delivers the light to a beam homogenizing and imaging arrangement 50 as a plurality of beams (one for each diode-laser bar module) partially overlapping at the entrance of arrangement 50. In the example described above there are actually four-hundred-ninety-four (494) individual light sources (emitters) in each diode-laser bar stack. Output from these 494 individual emitters is formed by arrangement 40 at plane 48 into what is effectively a single beam having a near-Gaussian distribution in the fast-axis. The arrangement 40 does this for all of the diode-laser bar stacks.

Arrangement 50 includes another fast-axis cylindrical micro-lens arrangement 52 to which beams from arrangement 40 are delivered. The micro-lens arrangement spreads the beams into diverging bundles, and a cylindrical lens element having positive optical power further spreads each of the bundles into a fast-axis output pupil of the arrangement to form the length of the line of light. Other elements focus the light in the slow-axis into the plane of the exit pupil.

It should be noted here that while the lens group of arrangement 40 described above includes one cylindrical negative optical element (element 42) and two cylindrical positive optical elements there can be as few as two elements or more than three elements. However one or more elements providing net negative power must immediately follow the micro-lens arrangements and the net power of all elements must be positive. Similarly the net optical power (in the fast-axis or line length direction) must be positive preferably with a positive element immediately following the micro-lens arrangement.

FIG. 5A and FIG. 5B are respectively slow-axis and fast-axis views schematically illustrating another preferred embodiment 70 of line-illuminating apparatus in accordance with the present invention. Apparatus 70 includes four fast-axis diode-laser bar stack modules together with functional component groups similar to those of apparatus 10 of FIGS. 1A and 1B, but is configured such that the apparatus forms a line of light having a length in the slow-axis direction of the diode-laser bar stacks. As in the description of apparatus 10, lens elements in FIGS. 5A and 5B are designated by a general reference numeral with entrance and exit surfaces thereof designated by suffices A and B, respectively, appended to the general reference numeral. Functional component groups corresponding to groups 40 and 50 of apparatus 10 are designated as groups 40S and 50S, respectively.

In apparatus 70, a light source 74 includes four fast-axis diode-laser bar stack modules 16, configured as described above. The modules are aligned spaced apart with slow-axes thereof aligned along the slow-axis direction. A beam homogenizing and expanding arrangement 40S includes a micro-lens arrangement 30 including two-spaced apart micro-lens arrays (as described above) for each diode-laser bar stack module in light source 74.

Arrangement 40S includes a cylindrical lens element 76 having negative optical power in the slow-axis direction, i.e., in the direction of the intended line-length. This element immediately follows the micro-lens arrays and has the same function as element 42 in group 40 of apparatus 10 described above. This element expands diverging ray bundles from the micro-lenses (only two bundles are depicted for simplicity of illustration). The diverging bundles are collected by a cylindrical lens element 78 and formed into nearly collimated bundles. Nearly collimated bundles formed from light from all diode-laser emitters will overlap at the entrance to beam homogenizing and imaging arrangement 50S.

Arrangement 50S includes a cylindrical micro-lens array pair 52 as in group 50 with the micro-lenses, here, however, aligned along the fast-axis direction A positive lens element 80 further spreads rays spread by the cylindrical micro-lens array pair such that diverging rays from each micro-lens are distributed along the length of line 66. In this example lens element 80 is a spherical element having positive power in both the fast and slow axes. Element 80, however, can be a cylindrical element distributing power from the micro-lens array only in the fast-axis. Rays collimated in the fast-axis direction are focused by element 80 and by fast-axis cylindrical elements 82, 84 and 86 to form the width of the line of light. Elements 82 and 84 function as an essentially afocal beam-expander in the fast-axis with element 86 responsible for final fast-axis focusing.

It should be noted, here again, that in arrangement 40S, a negative lens element immediately follows the micro-lens arrays while the net power of all elements in the arrangement is positive in the axis corresponding to the length direction of line 66. In arrangement 50S, an element having positive optical power in the axis corresponding to the length of the line of light immediately follows the micro-lens arrays of the arrangement. It is believed that in arrangement 70, collimation of the diode-laser bar output in the slow-axis may not be necessary. However the output must always be fast-axis collimated.

The performance of one example of apparatus 70 configured to provide a line having a length of about 200 mm and a width of about 0.2 mm was calculated using above reference optical design software. In this example the following assumptions were made.

Each diode laser bar has 19 emitters with a 0.5 mm pitch between emitters. There are 26 diode-laser bars in each stack with a pitch of 1.65 mm between the bars in the stack. Each bar has a FAC lens and a SAC lens-array as described above. The stacks are spaced apart by 7.65 mm along the slow-axis direction. Each bar has a total of 70 W output at a wavelength of 908 nanometers (nm) providing a total light source power of 7280 W (7.280 kW).

Micro-lenses in the micro-lens arrays 30A and 30 B have a radius of curvature (ROC) of 5.0 mm with a 0.5 mm pitch. The micro-lens array pair is spaced 20.0 mm from the SAC lens arrays. The ROC and pitch of the lenses is subject to variation in optimizing the distribution of illumination at the entrance to micro-lens arrays 52.

Lens element 76 is axially spaced 55.0 mm from the micro-lens array pair 30. The lens element is a fused silica lens having an axial thickness of 10 mm with surface 76A having a ROC of −120.0 mm and surface 76B being planar. Element 78 is a fused silica element having an axial thickness of 20.0 mm and is axially spaced from element 76 by 175.0 mm. Surface 78A is planar and surface 78B has an ROC of 200.0 mm.

Cylindrical micro-lens arrays in array pair 52 have a 17.0 mm ROC and a 10.0 mm pitch. The micro-lens array pair is spaced 215.0 mm from element 78 and the arrays are spaced apart by 25.0 mm Lens element 80 is a fused silica lens having an axial thickness of 25.0 mm, with surface 80A having an ROC of 350.0 mm and surface 80B being planar. Lens element 82 is a fused silica lens having an axial thickness of 15.0 mm with surface 82A having an ROC of −70.0 mm and surface 82B being planar. Element 82 is axially spaced 40.0 mm from element 80. Lens element 84 is a fused silica lens having an axial thickness of 20.0 mm with surface 84A being planar and surface 82B having an ROC of −137.0 mm. Element 84 is axially spaced 120.0 mm from element 82. Lens element 86 is a fused silica lens having an axial thickness of 20.0 mm with surface 86A being planar and with surface 84B having an ROC of −225 mm. Element 86 is axially spaced 20.0 mm from element 84. The axial distance from element 86 to plane 64 is 430.0 mm.

Figure 6:
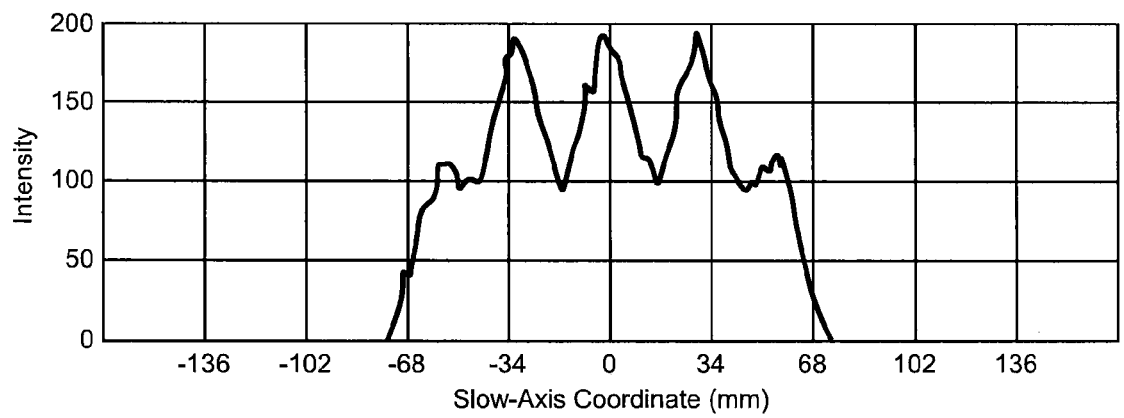
FIG. 6 is graph schematically illustrating calculated intensity distribution as a function of fast-axis coordinate for one example of the apparatus of FIGS. 5A and 5B at the entrance to the beam homogenizing and imaging optics.

FIG. 6 is a graph schematically illustrating intensity distribution in the slow-axis as a function of the slow-axis coordinate at the entrance to micro-lens array pair 52. It can be seen that this intensity distribution is not as uniform as the corresponding distribution in the fast-axis case of FIG. 3. It appears to approximate partially overlapping combination of four "double humped" intensity distributions, a double-humped distribution being characteristic a wide-strip diode-laser emitter. However, the use of a SAC in front of emitters in a bar improves the real fill-factor, and, by properly selecting the ROC of the micro-lens array pair 30, and the separation thereof, these humps could be minimized to deliver a smoothened overlapped Gaussian distribution at the entrance of second micro-lens array pair 52.

Figure 7:
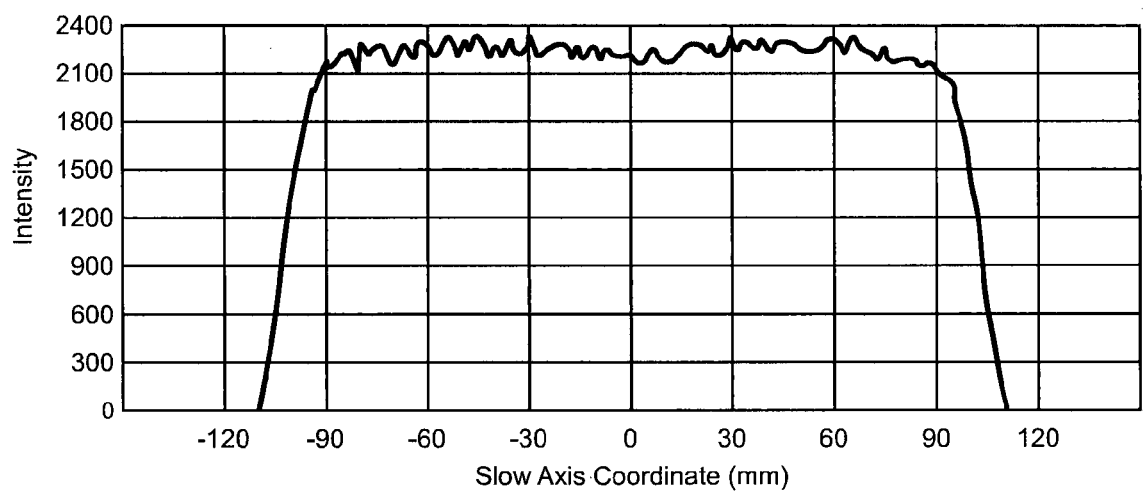
FIG. 7 is graph schematically illustrating calculated intensity distribution as a function of fast-axis coordinate for the example of the apparatus of FIGS. 5A and 5B in a line of light formed by the beam homogenizing and imaging optics.

FIG. 7 is a graph schematically illustrating intensity distribution in the slow-axis as a function of the slow-axis coordinate in line 66 in plane 64. It can be seen that despite the relatively poor uniformity of the input to homogenizing and imaging arrangement 50S, the final line-uniformity is comparable with that of the fast-axis case depicted in the graph of FIG. 4. Calculations indicated that 5.8 kW of radiation power would be delivered into the line of light, comparable with the fast-axis example discussed above.

In summary, the present invention is described above with reference to a preferred and other embodiments. The invention is not limited to the embodiments described and depicted. Rather the invention is limited only by the claims appended hereto.

What is claimed is:

1. Optical apparatus for forming a line of radiation having a length and a width, the apparatus comprising:

a plurality of spaced-apart stacks of diode-laser bars, each of the diode-laser bars having a plurality of diode-laser emitters, and having a fast-axis and a slow-axis perpendicular to the fast-axis and parallel to a length dimension of the bars, the diode-laser bars in the stacks stacked in the fast-axis direction thereof, wherein the stacks of diode-laser bars are aligned one above another in the fast-axis direction of the diode-laser bars and the length direction of the line of radiation is parallel to the fast-axis direction;

a plurality of collimating arrangements corresponding in number to the number of diode-laser bars for collimating the output radiation of the diode-laser bars in the diode-laser bars stacks in at least the fast-axis direction thereby forming a plurality of output radiation beams corresponding in number to the plurality of diode-laser bar stacks;

a first optical arrangement configured to collect the output radiation beams from all of the diode-laser bar stacks, homogenize and expand the beams in the length direction of the line of radiation and partially overlap the homogenized expanded beams in a first plane at a predetermined distance from the first optical arrangement wherein the first optical arrangement includes a plurality of pairs of cylindrical microlens arrays, one for each of the plurality of diode-laser bar stacks with each array including the same number of cylindrical microlenses as the number of diode-laser bars in the stack, the cylindrical lenses in the arrays being aligned with each other, aligned with the slow-axis of the diode-laser bars, and having positive optical power in the fast-axis and zero optical power in the slow-axis, and a first group of cylindrical lens elements forming a beam expander having positive optical power in the fast-axis and zero optical-power in the slow-axis, the pairs of microlens arrays being located between the diode-laser bar stacks and the group of lens elements; and a second optical arrangement configured to homogenize and image the partially overlapped and expanded beams in a second plane at a predetermined distance from the second optical arrangement to form the line of radiation, with the homogenizing and imaging being arranged such that the line of radiation has an about uniform distribution of intensity along the length thereof.

2. The apparatus of claim 1, wherein the second optical arrangement includes one pair of cylindrical microlens arrays adjacent the first plane and arranged to intercept and transmit rays from the first optical arrangement, each array including the same number of cylindrical microlenses, the cylindrical lenses in the arrays being aligned with each other, aligned in the slow-axis direction of the diode-laser bars, and having positive optical power in the fast-axis and zero optical power in the slow-axis, and a second group of optical elements arranged such that the intercepted and transmitted rays from the one pair of microlens arrays are focused in the slow-axis direction in the second plane to define the width of the line of radiation and spread in the fast-axis direction in the second plane to form the length of the line of radiation.

3. Optical apparatus for forming a line of radiation having a length and a width, the apparatus comprising:

a plurality of spaced-apart stacks of diode-laser bars, each of the diode-laser bars having a plurality of diode-laser emitters, and having a fast-axis and a slow-axis perpendicular to the fast-axis and parallel to a length dimension of the bars, the diode-laser bars in the stacks stacked in the fast-axis direction thereof, wherein the stacks of diode-laser bars are aligned with each other in the slow-axis direction of the diode-laser bars and the length direction of the line of radiation is parallel to the slow-axis direction;

a plurality of collimating arrangements corresponding in number to the number of diode-laser bars for collimating the output radiation of the diode-laser bars in the diode-laser bars stacks in at least the fast-axis direction thereby forming a plurality of output radiation beams corresponding in number to the plurality of diode-laser bar stacks;

a first optical arrangement configured to collect the output radiation beams from all of the diode-laser bar stacks, homogenize and expand the beams in the length direction of the line of radiation and partially overlap the homogenized expanded beams in a first plane at a predetermined distance from the first optical arrangement wherein the first optical arrangement includes a plurality of pairs of cylindrical microlens arrays, one for each of the plurality of diode-laser bar stacks with each array including the same number of cylindrical microlenses as the number of diode-laser bars in the stack, the cylindrical lenses in the arrays being aligned with each other, aligned with the slow-axis of the diode-laser bars, and having positive optical power in the slow-axis and zero optical power in the fast-axis, and a first group of cylindrical lens elements forming a beam expander having positive optical power in the slow-axis and zero optical-power in the fast-axis, the pairs of microlens arrays being located between the diode-laser bar stacks and the first group of lens elements; and a second optical arrangement configured to homogenize and image the partially overlapped and expanded beams in a second plane at a predetermined distance from the second optical arrangement to form the line of radiation, with the homogenizing and imaging being arranged such that the line of radiation has an about uniform distribution of intensity along the length thereof.

4. The apparatus of claim 3, wherein the second optical arrangement includes one pair of cylindrical microlens arrays arranged adjacent the first plane to intercept and transmit rays from the first optical arrangement, each array including the same number of cylindrical microlenses, the cylindrical lenses in the arrays being aligned with each other, aligned in the fast-axis direction of the diode-laser bars, and having positive optical power in the slow-axis and zero optical power in the fast-axis, and a second group of optical elements configured and arranged such that the intercepted and transmitted rays from the one pair of microlens arrays are focused in the fast-axis direction in the second plane to define the width of the line of radiation and spread in the slow-axis direction in the second plane to form the length of the line of radiation.

5. Optical apparatus for forming a line of radiation having a length and a width, the apparatus comprising:

a plurality of spaced-apart stacks of diode-laser bars, each of the diode-laser bars having a plurality of diode-laser emitters, and having a fast-axis and a slow-axis perpendicular to the fast-axis and parallel to a length dimension of the bars, the diode-laser bars in the stacks being stacked in the fast-axis direction thereof and the stacks of diode-laser bars being aligned one above another in the fast-axis direction of the diode-laser bars;

a plurality of collimating arrangements corresponding in number to the number of diode-laser bars for collimating the output radiation of the diode-laser bars in the diode-laser bars stacks in at least the fast-axis direction thereby forming a plurality of output radiation beams corresponding in number to the plurality of diode-laser bar stacks;

a first optical arrangement configured to collect the output radiation beams from all of the diode-laser bar stacks, homogenize and expand the beams in the fast-axis direction radiation and partially overlap the homogenized expanded beams in a first plane at a predetermined distance from the first optical arrangement, the first optical arrangement including a plurality of pairs of cylindrical microlens arrays, one for each of the plurality of diode-laser bar stacks with each array including the same number of cylindrical microlenses as the number of diode-laser bars in the stack, the cylindrical lenses in the arrays being aligned with each other, aligned with the slow-axis of the diode-laser bars, and having positive optical power in the fast-axis and zero optical power in the slow-axis, and a first group of lens elements forming a beam expander having positive optical power in the fast-axis and zero optical-power in the slow-axis, the pairs of microlens arrays being located between the diode-laser bar stacks and the first group of lens elements; and a second optical arrangement configured to homogenize and image the partially overlapped and expanded beams in a second plane at a predetermined distance from the second optical arrangement to form the line of radiation, the second optical arrangement including one pair of cylindrical microlens arrays adjacent the first plane and arranged to intercept and transmit rays from the first optical arrangement, each array including the same number of cylindrical microlenses, the cylindrical lenses in the arrays being aligned with each other, aligned in the slow-axis direction of the diode-laser bars, and having positive optical power in the fast-axis and zero optical power in the slow-axis, and a second group of optical elements arranged such that the intercepted and transmitted rays from the one pair of microlens arrays are focused in the slow-axis direction in the second plane to define the width of the line of radiation and spread in the fast-axis direction in the second plane to form the length of the line of radiation.

6. The apparatus of claim 5, wherein there are four diode-laser bar stacks.

7. The apparatus of claim 6, wherein there are 26 diode-laser bars in each diode-laser bar stack.

8. The apparatus of claim 5, wherein the first group of optical elements includes an optical element having negative optical power in the fast-axis and zero optical power in the slow-axis and first and second optical elements each thereof having positive power in the fast-axis and zero optical power in the slow-axis, the elements being listed in the direction of propagation of radiation through the apparatus.

9. The apparatus of claim 8, where second group of optical elements includes an element having positive optical power in the fast-axis and the slow-axis, an optical element having negative optical power in the slow-axis and zero optical power in the fast-axis and first and second optical elements having positive optical power in the slow-axis and zero optical power in the fast-axis.

10. The apparatus of claim 5, wherein the line of radiation has a length of about 200 millimeters.

11. Optical apparatus for forming a line of radiation having a length and a width, the apparatus comprising:
a plurality of spaced-apart stacks of diode-laser bars, each of the diode-laser bars having a plurality of diode-laser emitters, and having a fast-axis and a slow-axis perpendicular to the fast-axis and parallel to a length dimension of the bars, the diode-laser bars in the stacks being stacked in the fast-axis direction thereof and the stacks of diode-laser bars being aligned with each other in the slow-axis direction of the diode-laser bars;
a plurality of collimating arrangements corresponding in number to the number of diode-laser bars for collimating the output radiation of the diode-laser bars in the diode-laser bars stacks in at least the fast-axis direction thereby forming a plurality of output radiation beams corresponding in number to the plurality of diode-laser bar stacks;
a first optical arrangement configured to collect the output radiation beams from all of the diode-laser bar stacks, homogenize and expand the beams in the slow-axis direction and partially overlap the homogenized expanded beams in a first plane at a predetermined distance from the first optical arrangement, the first optical arrangement including a plurality of pairs of cylindrical microlens arrays, one for each of the plurality of diode-laser bar stacks with each array including the same number of cylindrical microlenses as the number of diode-laser bars in the stack, the cylindrical lenses in the arrays being aligned with each other, aligned with the slow-axis of the diode-laser bars, and having positive optical power in the fast-axis and zero optical power in the slow-axis, and a first group of lens elements forming a beam expander having positive optical power in the slow-axis and zero optical-power in the fast-axis, the pairs of microlens arrays being located between the diode-laser bar stacks and the first group of lens elements; and
a second optical arrangement configured to homogenize and image the partially overlapped and expanded beams in a second plane at a predetermined distance from the second optical arrangement to form the line of radiation, the second optical arrangement including one pair of cylindrical microlens arrays adjacent the first plane and arranged to intercept and transmit rays from the first optical arrangement, each array including the same number of cylindrical microlenses, the cylindrical lenses in the arrays being aligned with each other, aligned in the fast-axis direction of the diode-laser bars, and having positive optical power in the slow-axis and zero optical power in the fast-axis, and a second group of optical elements arranged such that the intercepted and transmitted rays from the one pair of microlens arrays are focused in the fast-axis direction in the second plane to define the width of the line of radiation and spread in the slow-axis direction in the second plane to form the length of the line of radiation.

12. The apparatus of claim 11, wherein there are four diode-laser bar stacks.

13. The apparatus of claim 12, wherein there are 26 diode-laser bars in each diode-laser bar stack.

14. The apparatus of claim 11, wherein the first group of optical elements includes an optical element having negative optical power in the slow-axis and zero optical power in the fast-axis and an optical element having positive power in the slow-axis and zero optical power in the fast-axis, the elements being listed in the direction of propagation of radiation through the apparatus.

15. The apparatus of claim 14, where second group of optical elements includes an element having positive optical power in the fast-axis and the slow-axis, an optical element having negative optical power in the fast-axis and zero optical power in the slow-axis and first and second optical elements having positive optical power in the fast-axis and zero optical power in the slow-axis.

16. The apparatus of claim 11, wherein the line of radiation has a length of about 200 millimeters.

* * * * *